US012694182B2

(12) United States Patent
Pandev

(10) Patent No.: US 12,694,182 B2
(45) Date of Patent: Jul. 28, 2026

(54) SEMICONDUCTOR PROFILE MEASUREMENT BASED ON A SCANNING CONDITIONAL MODEL

(71) Applicant: KLA Corporation, Milpitas, CA (US)

(72) Inventor: Stilian Ivanov Pandev, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 493 days.

(21) Appl. No.: 17/479,870

(22) Filed: Sep. 20, 2021

(65) Prior Publication Data

US 2023/0092729 A1     Mar. 23, 2023

(51) Int. Cl.
G06F 30/36       (2020.01)
G01N 21/95       (2006.01)
G01N 23/201      (2018.01)

(52) U.S. Cl.
CPC ......... G06F 30/36 (2020.01); G01N 21/9501 (2013.01); G01N 23/201 (2013.01); G01N 2223/6116 (2013.01)

(58) Field of Classification Search
None
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |
| 6,023,338 A | 2/2000 | Bareket |
| 6,429,943 B1 | 8/2002 | Opsal et al. |
| 6,716,646 B1 | 4/2004 | Wright et al. |
| 6,778,275 B2 | 8/2004 | Bowes |
| 6,787,773 B1 | 9/2004 | Lee |

(Continued)

FOREIGN PATENT DOCUMENTS

| KR | 10-2017-0100710 | 9/2017 |
| TW | 201841066 A | 11/2018 |

(Continued)

OTHER PUBLICATIONS

Horiba, "Spectroscopic Ellipsometry: Basic Concepts" (Year: 2022).*

(Continued)

*Primary Examiner* — Lina Cordero
(74) *Attorney, Agent, or Firm* — Spano Law Group

(57) ABSTRACT

Methods and systems for measuring semiconductor structures based on a trained scanning conditional measurement model are described herein. A scanning conditional model is trained based on Design Of Experiments (DOE) measurement data associated with known values of one or more parameters of interest and a set of perturbed values of the one or more parameters of interest. The trained conditional model minimizes the output of an error function characterizing the error between the known values of the perturbed values of the one or more parameters of interest for the given DOE measurement data. During inference, an error value associated with each candidate value of one or more parameters of interest is determined by the trained scanning conditional measurement model. The estimated value of the parameter of interest is the candidate value of the parameter of interest associated with the minimum error value.

23 Claims, 8 Drawing Sheets

(56) References Cited

U.S. PATENT DOCUMENTS

| | | | |
|---|---|---|---|
| 6,992,764 B1 | 1/2006 | Yang et al. | |
| 7,242,477 B2 | 7/2007 | Mieher et al. | |
| 7,321,426 B1 | 1/2008 | Poslavsky et al. | |
| 7,406,153 B2 | 7/2008 | Berman | |
| 7,478,019 B2 | 1/2009 | Zangooie et al. | |
| 7,626,702 B2 | 12/2009 | Ausschnitt et al. | |
| 7,656,528 B2 | 2/2010 | Abdulhalim et al. | |
| 7,751,046 B2 * | 7/2010 | Levy | G01N 21/27 356/636 |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 9,291,554 B2 | 3/2016 | Kuznetsov et al. | |
| 9,826,614 B1 | 11/2017 | Bakeman et al. | |
| 9,885,962 B2 | 2/2018 | Veldman et al. | |
| 9,915,522 B1 | 3/2018 | Jiang et al. | |
| 10,013,518 B2 | 7/2018 | Bakeman et al. | |
| 10,101,670 B2 | 10/2018 | Pandev et al. | |
| 10,152,678 B2 | 12/2018 | Pandev et al. | |
| 10,324,050 B2 | 6/2019 | Hench et al. | |
| 10,352,695 B2 | 7/2019 | Dziura et al. | |
| 2003/0021465 A1 | 1/2003 | Adel et al. | |
| 2003/0062339 A1 * | 4/2003 | Houge | H01J 37/32935 118/712 |
| 2004/0017575 A1 * | 1/2004 | Balasubramanian | G03F 7/70625 356/625 |
| 2004/0183019 A1 | 9/2004 | Mandelis et al. | |
| 2006/0181713 A1 * | 8/2006 | Bischoff | G01N 21/95607 257/E21.53 |
| 2007/0176128 A1 | 8/2007 | Van Bilsen et al. | |
| 2007/0221842 A1 | 9/2007 | Morokuma et al. | |
| 2009/0040613 A1 * | 2/2009 | Feng | G01N 21/4788 359/566 |
| 2009/0152463 A1 | 6/2009 | Toyoda et al. | |
| 2011/0266440 A1 | 11/2011 | Boughorbel et al. | |
| 2012/0292502 A1 | 11/2012 | Langer et al. | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0064445 A1 | 3/2014 | Adler | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2015/0046118 A1 | 2/2015 | Pandev et al. | |
| 2015/0046121 A1 | 2/2015 | Dziura et al. | |
| 2015/0110249 A1 | 4/2015 | Bakeman et al. | |
| 2015/0117610 A1 | 4/2015 | Veldman et al. | |
| 2015/0204664 A1 | 7/2015 | Bringoltz et al. | |
| 2015/0285749 A1 | 10/2015 | Moncton et al. | |
| 2015/0300965 A1 | 10/2015 | Sezginer et al. | |
| 2016/0202193 A1 | 7/2016 | Hench et al. | |
| 2016/0320319 A1 | 11/2016 | Hench et al. | |
| 2016/0377561 A1 | 12/2016 | Ramachandran et al. | |
| 2017/0167862 A1 | 6/2017 | Dziura et al. | |
| 2017/0363950 A1 * | 12/2017 | Sriraman | G03F 1/36 |
| 2018/0106735 A1 | 4/2018 | Gellineau et al. | |
| 2018/0108578 A1 | 4/2018 | Pandev et al. | |
| 2018/0113084 A1 | 4/2018 | Hench et al. | |
| 2018/0328868 A1 | 11/2018 | Bykanov et al. | |
| 2019/0017946 A1 | 1/2019 | Wack et al. | |
| 2019/0293578 A1 | 9/2019 | Gellineau | |
| 2019/0369503 A1 | 12/2019 | Ypma et al. | |
| 2021/0035833 A1 | 2/2021 | Feng et al. | |
| 2021/0142467 A1 | 5/2021 | Burkhardt et al. | |
| 2021/0165398 A1 | 6/2021 | Pandev et al. | |

FOREIGN PATENT DOCUMENTS

| | | | |
|---|---|---|---|
| WO | 2018175213 A1 | 9/2018 | |
| WO | 2021162887 A1 | 8/2021 | |

OTHER PUBLICATIONS

International Search Report mailed on Jan. 5, 2023, for PCT Application No. PCT/US2022/043563. Filed on Sep. 15, 2022 by KLA Corporation, 3 pages.

Lemaillet, Germer, Kline et al., "Intercomparison between optical and x-ray scatterometry measurements of FinFET structures" by Proc. SPIE, v.8681, p. 86810Q (2013).

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

* cited by examiner

240

241

245

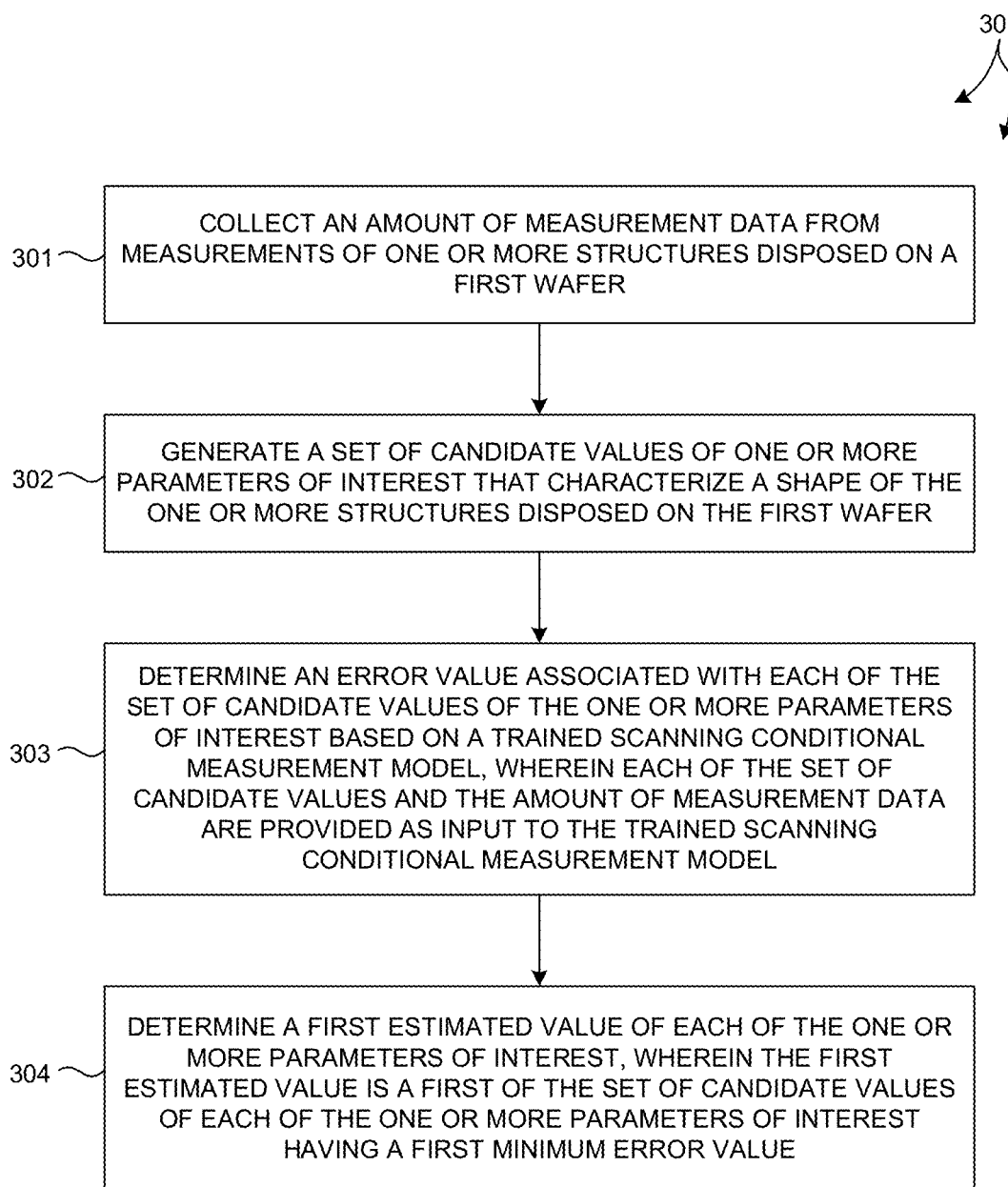

300

301 — COLLECT AN AMOUNT OF MEASUREMENT DATA FROM MEASUREMENTS OF ONE OR MORE STRUCTURES DISPOSED ON A FIRST WAFER

302 — GENERATE A SET OF CANDIDATE VALUES OF ONE OR MORE PARAMETERS OF INTEREST THAT CHARACTERIZE A SHAPE OF THE ONE OR MORE STRUCTURES DISPOSED ON THE FIRST WAFER

303 — DETERMINE AN ERROR VALUE ASSOCIATED WITH EACH OF THE SET OF CANDIDATE VALUES OF THE ONE OR MORE PARAMETERS OF INTEREST BASED ON A TRAINED SCANNING CONDITIONAL MEASUREMENT MODEL, WHEREIN EACH OF THE SET OF CANDIDATE VALUES AND THE AMOUNT OF MEASUREMENT DATA ARE PROVIDED AS INPUT TO THE TRAINED SCANNING CONDITIONAL MEASUREMENT MODEL

304 — DETERMINE A FIRST ESTIMATED VALUE OF EACH OF THE ONE OR MORE PARAMETERS OF INTEREST, WHEREIN THE FIRST ESTIMATED VALUE IS A FIRST OF THE SET OF CANDIDATE VALUES OF EACH OF THE ONE OR MORE PARAMETERS OF INTEREST HAVING A FIRST MINIMUM ERROR VALUE

FIG. 11

SEMICONDUCTOR PROFILE MEASUREMENT BASED ON A SCANNING CONDITIONAL MODEL

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

Many metrology techniques are indirect methods of measuring physical properties of a specimen under measurement. In most cases, the raw measurement signals cannot be used to directly determine the physical properties of the specimen. Instead, a measurement model is employed to estimate the values of one or more parameters of interest based on the raw measurement signals. For example, ellipsometry is an indirect method of measuring physical properties of the specimen under measurement. In general, a physics-based measurement model or a machine learning based measurement model is required to determine the physical properties of the specimen based on the raw measurement signals (e.g., $\alpha_{meas}$ and $\beta_{meas}$).

In some examples, a physics-based measurement model is created that attempts to predict the raw measurement signals (e.g., $\alpha_{meas}$ and $\beta_{meas}$) based on assumed values of one or more model parameters. As illustrated in equations (1) and (2), the measurement model includes parameters associated with the metrology tool itself, e.g., machine parameters ($P_{machine}$), and parameters associated with the specimen under measurement. When solving for parameters of interest, some specimen parameters are treated as fixed valued ($P_{spec-fixed}$) and other specimen parameters of interest are floated ($P_{spec-float}$), i.e., resolved based on the raw measurement signals.

$$\alpha_{model}=f(P_{machine},P_{spec-fixed},P_{spec-float}) \tag{1}$$

$$\beta_{model}=g(P_{machine},P_{spec-fixed},P_{spec-float}) \tag{2}$$

Machine parameters are parameters used to characterize the metrology tool (e.g., ellipsometer 101). Exemplary machine parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the machine parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values (e.g., $\alpha_{model}$ and $\beta_{model}$) are calculated and compared to the raw measurement data in an iterative manner until a set of specimen parameter values are determined that results in a sufficiently close match between the model output values and the experimentally measured values (e.g., $\alpha_{meas}$ and $\beta_{meas}$). In some other examples, the floating parameters are resolved by a search through a library of pre-computed solutions to find the closest match.

Implementing a physics-based measurement model to predict values of one or more parameters characterizing a structure under measurement from measured signals (e.g., spectra, X-ray diffraction images, etc.) has a number of disadvantages. In practice, the development of a physics-based model is costly in terms of time, effort, and computational effort. In many cases, the compromises necessary to realize a computationally tractable physics based model have an undesirable impact on measurement accuracy. In addition, a physics based measurement model may lead to misleading results when multiple solutions exist, i.e., when the same set of measurement signals has more than one solution for the value of a parameter of interest. In these examples, the regression process employed when implementing a physics-based measurement model strives to find a single solution among multiple solutions, which results in a loss of measurement completeness.

In some other examples, a trained machine learning based measurement model is employed to directly estimate values of parameters of interest based on raw measurement data. In these examples, a machine learning based measurement model takes raw measurement signals as model input and generates values of the parameters of interest as model output.

A machine learning based measurement model must be trained to generate useful estimates of parameters of interest for a particular measurement application. Generally, model training is based on raw measurement signals collected from a specimen having known values of the parameters of interest (i.e., Design of Experiments (DOE) data).

A machine learning based measurement model is parameterized by a number of weight parameters. Typically, the machine learning based measurement model is trained by a regression process that minimizes total output error (e.g., ordinary least squares regression). The values of the weight parameters are iteratively adjusted to minimize the differences between the known, reference values of the parameters of interest and values of the parameters of interest estimated by the machine learning based measurement model based on the measured raw measurement signals.

The traditional approach of training a machine learning based measurement model to predict values of one or more parameters characterizing a structure under measurement from measured signals (e.g., spectra, X-ray diffraction images, etc.) has a number of disadvantages. In practice, the model training requires a large number of DOE measurement samples, which are often costly to generate. In addition, the stability of the model training is often compromised when multiple solutions exist, i.e., when the same set of measurement signals has more than one solution for the value of a parameter of interest. In these examples, the traditional approach to training a machine learning based measurement model strives to find a middle ground between multiple solutions, which results in a loss of measurement accuracy.

Future metrology applications present challenges for metrology due to increasingly small resolution requirements, multi-parameter correlation, increasingly complex geometric structures, and increasing use of opaque materials. Thus, methods and systems for improved measurement model training and parameter inference are desired.

SUMMARY

Methods and systems for measuring semiconductor structures based on a trained scanning conditional measurement model are described herein. A scanning conditional model is trained based on Design Of Experiments (DOE) measurement data associated with known values of one or more parameters of interest and a set of perturbed values of the one or more parameters of interest. The trained conditional model minimizes the output of an error function that characterizes the error between the known values of the one or more parameters of interest and the perturbed values of the one or more parameters of interest for the given DOE measurement data.

In addition, values of one or more parameters of interest are estimated from actual measurement data collected from a semiconductor structure under measurement based on a trained scanning conditional measurement model. The values of the one or more parameters of interest are determined by scanning through a range of candidate values of one or more parameters of interest. The trained scanning conditional measurement model determines an error value associated with each candidate value of the one or more parameters of interest. The estimated value of the parameter of interest is the candidate value of the parameter of interest associated with the minimum error value.

In one aspect, a geometric model of a structure under measurement is determined. A geometric model characterizes the geometry of a structure in terms of one or more parameters of interest. In this manner, values of the one or more parameters of interest define the shape of a structure under measurement. In some embodiments, a geometric model defines the shape of a structure in two dimensions. In some other embodiments, a geometric model defines the shape of a structure in three dimensions.

In another aspect, a DOE training dataset of measurement data is generated based on a DOE set of geometric model parameter values.

In another aspect, a scanning conditional model is trained based on the training dataset of measurement data corresponding to the DOE set of geometric model parameter values and a set of perturbed values of the DOE set of geometric model parameters.

In another aspect, the trained scanning conditional measurement model is employed to estimate values of parameters of interest based on actual measurements of structures having unknown values of one or more parameters of interest. Measurement data and a set of candidate values associated with each parameter of interest are provided as input to a trained scanning conditional measurement model. The trained scanning conditional measurement model generates an error value associated with each candidate value. The estimated value of each parameter of interest is selected as the candidate value of each parameter of interest having the smallest error value.

In general, any number of geometric parameters may be employed as input to train and use a scanning conditional measurement model. Similarly, any combination of measurement signals may be employed as input to train and use a scanning conditional measurement model (e.g., signals from one or more optical metrology systems, one or more x-ray metrology systems, or a combination thereof).

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

BRIEF DESCRIPTION OF THE DRAWINGS

FIG. 11 illustrates a flowchart of a method 300 for training a scanning conditional measurement model for estimating values of parameters of interest.

DETAILED DESCRIPTION

Reference will now be made in detail to background examples and some embodiments of the invention, examples of which are illustrated in the accompanying drawings.

Methods and systems for measurements of semiconductor structures based on a trained scanning conditional measurement model are described herein.

A scanning conditional model is trained based on Design Of Experiments (DOE) measurement data associated with known values of one or more parameters of interest and a set of perturbed values of the one or more parameters of interest. The trained conditional model minimizes the output of an error function. The error function characterizes the error between the known values of the one or more parameters of interest and the perturbed values of the one or more parameters of interest for the given DOE measurement data.

Values of one or more parameters of interest are estimated from actual measurement data collected from a semiconductor structure under measurement based on a trained scanning conditional measurement model. The values of the one or more parameters of interest are determined by scanning through a range of candidate values of the one or more parameters of interest. The trained scanning conditional measurement model is employed to determine an error value associated with each candidate value of the one or more parameters of interest. The estimated value of the parameter of interest is the candidate value of the parameter of interest associated with the minimum error value.

A scanning conditional measurement model as described herein enables the training of a machine learning based measurement model with fewer DOE measurement samples because errors are learned based on many perturbations of each DOE data set. Thus, the total number of training samples increases significantly for a given number of DOE measurement samples. Furthermore, the scanning nature of the scanning conditional modelling technique enables the trained model to accurately predict multiple solutions for a parameter of interest. In addition, a scanning conditional measurement model as described herein enables the trained model to reconstruct a two dimensional image or a three-dimensional image of a structure under measurement.

Figure 1:
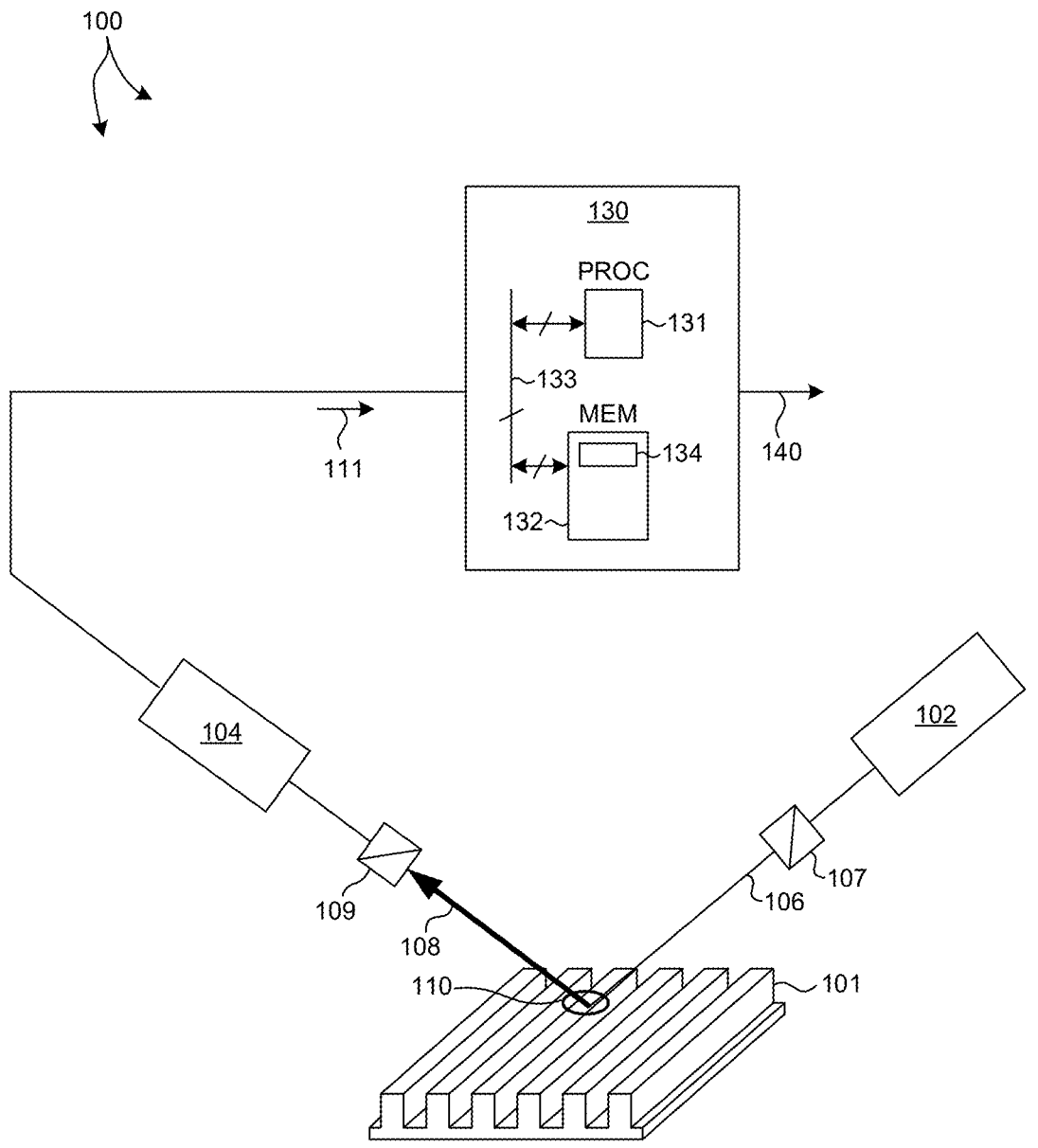
FIG. 1 depicts an illustration of a metrology system 100 for measuring characteristics of a semiconductor structure in accordance with the exemplary methods presented herein.

FIG. 1 illustrates a system 100 for measuring characteristics of a specimen in accordance with the exemplary methods presented herein. As shown in FIG. 1, the system 100 may be used to perform spectroscopic ellipsometry measurements of structure 101 depicted in FIG. 1. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 100-2500 nm) to the structure disposed on the surface of the specimen over a measurement spot 110. In turn, the spectrometer 104 is configured to receive illumination reflected from structure 101. It is further noted that the light emerging from the illuminator 102 is polarized using a polarization state generator 107 to produce a polarized illumination beam 106. The radiation reflected by structure 101 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer. These spectra 111 are passed to the computing system 130 for analysis of the structure as described herein.

As depicted in FIG. 1, system 100 includes a single measurement technology (i.e., SE). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof, including, by way of non-limiting example, soft X-ray reflectometry, small angle x-ray scatterometry, an imaging based metrology system, a hyperspectral imaging based metrology system, a scatterometry overlay metrology system, etc.

In a further embodiment, system 100 may include one or more computing systems 130 employed to perform measurements of structures based on measurement models developed in accordance with the methods described herein. The one or more computing systems 130 may be communicatively coupled to the spectrometer 104. In one aspect, the one or more computing systems 130 are configured to receive measurement data 111 associated with measurements of a structure under measurement (e.g., structure 101).

In some embodiments, computing system 130 is configured to develop and train a scanning conditional measurement model as well as execute the trained scanning conditional model to estimate values of one or more parameters of interest as described herein.

In one aspect, a geometric model of a structure under measurement is determined. A geometric model characterizes the geometry of a structure in terms of one or more parameters of interest. In this manner, values of the one or more parameters of interest define the shape of a structure under measurement. In some embodiments, a geometric model defines the shape of a structure in two dimensions. In some other embodiments, a geometric model defines the shape of a structure in three dimensions.

In some examples, a geometric model is developed based on geometric primitives (e.g., trapezoids, etc.) and parameterized based on knowledge of the semiconductor processes employed to fabricate the structure.

In some examples, a geometric model is developed based on geometric primitives (e.g., trapezoids, etc.) and parameterized based on reference measurement data provided by a trusted reference metrology system. In one example, scanning electron microcopy (SEM) images are employed to directly measure the shape of a semiconductor structure and the measured shapes are employed to parameterize the geometric model.

In some examples, a geometric model is developed based on a family of reference shape profiles. In some examples, the reference shape profiles are determined from measurements of semiconductor structures fabricated in accordance with a DOE of process parameters.

In some examples, a geometric model is developed by simulation (e.g., a process simulation tool that predicts the shape of a structure fabricated in a accordance with a series of fabrication steps such as etch, lithography, etc.). In some of these examples, the geometric model includes a dataset of synthetically generated shape profiles based on a DOE of process parameters.

In some embodiments, a geometric model of a structure under measurement is characterized by a grid array of voxels spanning a three dimensional volume enveloping the measured structure. The size and spacing of the voxels of the array is known apriori. Each voxel of the voxel model is parameterized by a value of a property (e.g., transparency, electron density, etc.) associated with each voxel. In this manner the parameter values of the voxel model define a three dimensional image of the geometry of the structure under measurement. In typical semiconductor metrology applications, a voxel model of a measured structure includes a large number of voxels (e.g., one million or more voxels) to provide sufficient resolution to accurately estimate parameters of interest (e.g., critical dimensions, height, sidewall angle, etc.).

In another aspect, a DOE training dataset of measurement data, $S_i^{DOE}$, is generated based on a DOE set of geometric model parameter values, $P_i^{DOE}$.

In some embodiments, the DOE training dataset is measurement data collected from structures fabricated in accordance with a DOE set of parameter values, $P_i^{DOE}$. In some embodiments, the value of each DOE parameter associated with each of the measured structures is measured by a trusted reference metrology system (e.g., SEM). In some embodiments, the value of each DOE parameter value associated with each of the measured structures is a known, programmed value employed to fabricate the measured structures.

In some other embodiments, the DOE set of geometric model parameter values are known, programmed parameter values, and the corresponding training dataset of measurement data, $S_i^{DOE}$, is generated by metrology simulation. In these examples, a metrology simulation tool simulates the training dataset of measurement data, $S_i^{DOE}$, generated by the metrology tool in response to the measurement of a structure having a known, programmed shape characterized by the DOE of parameter values, $P_i^{DOE}$. In some embodiments, the simulated metrology tool is the same metrology tool employed to ultimately measure structures having unknown values of one or more parameters of interest.

In some embodiments, the DOE set of geometric model parameter values are generated by process simulation. In these embodiments, a process simulator is employed to generate a dataset of geometric models having known geometric parameter values, $P_i^{DOE}$, based on a DOE of known, programmed process parameters ($PP_i$). In turn, a metrology simulator is employed to generate the training dataset of measurement data, $S_i^{DOE}$, corresponding to the known, geometric parameter values.

In another aspect, a scanning conditional model is trained based on the training dataset of measurement data, $S_i^{DOE}$, corresponding to the DOE set of geometric model parameter values, $P_i^{DOE}$, and a set of perturbed values of the DOE set of geometric model parameters.

Figure 2:
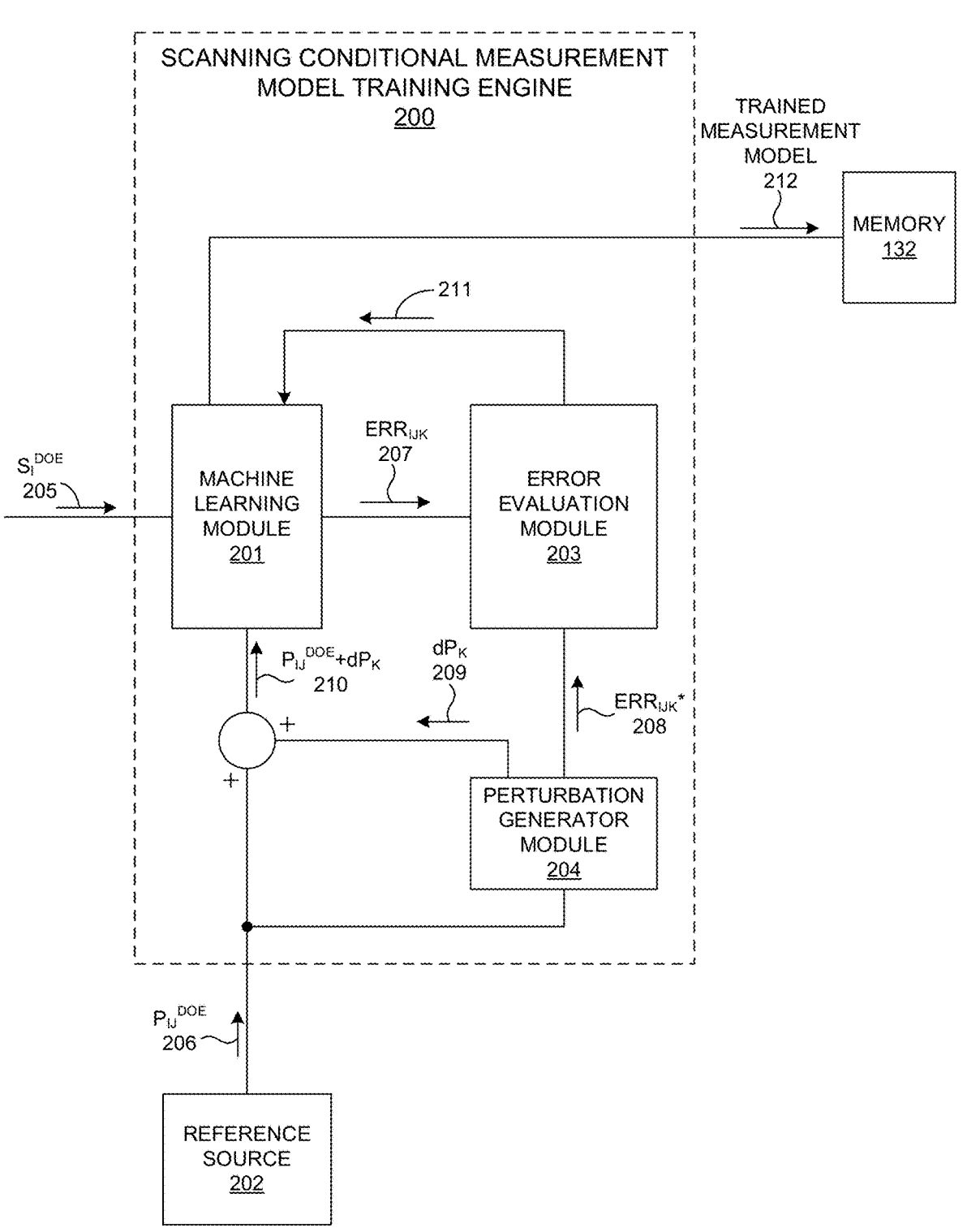
FIG. 2 is a diagram illustrative of an exemplary scanning conditional measurement model training engine 200 in one embodiment.

FIG. 2 is a diagram illustrative of a scanning conditional measurement model training engine 200 in one embodiment. As depicted in FIG. 2, scanning conditional measurement model training engine 200 includes a machine learning module 201, an error evaluation module 203, and a perturbation generator module 204. A training dataset of measurement data, $S_i^{DOE}$ 205, is provided as an input to machine learning module 201.

In some examples, the scanning conditional measurement model is a neural network model. As depicted in FIG. 2, machine learning module 201 evaluates a neural network model for data sets $S_i^{DOE}$ 205 and perturbed parameter values, $(P_{ij}^{DOE}+dP_k)$ 210, where i is an index indicative of each measurement sample, j is an index indicative of each individual parameter, and k is an index indicative of each error sample. The output of the neural network model is an error value, $ERR_{ijk}$ 207, communicated to error evaluation module 203. Error evaluation module 203 compares the error value, $ERR_{ijk}$ 207, determined by the neural network model with a known error value, $ERR_{ijk}^*$ 208, associated with each error sample and each perturbed parameter value, $(P_{ij}^{DOE}+dP_k)$ 210. Error evaluation module 203 updates the neural network weighting values 211 to minimize a function characterizing a difference between determined and known error values (e.g., quadratic error function, linear error function, or any other suitable difference function). The updated neural network weighting values 211 are communicated to machine learning module 201. Machine learning module 201 updates the neural network model with the updated neural network weighting values for the next iteration of the training process. The iteration continues until the function characterizing a difference between determined and known error values is minimized. The resulting trained scanning condition measurement model 212 is communicated to memory (e.g., memory 132). The trained scanning condition measurement model 212 predicts the error of a parameter value and the true parameter value for the provided measurement signals (e.g., spectra).

As depicted in FIG. 2, scanning conditional measurement model training engine 200 receives DOE geometric model parameter values, $P_{ij}^{DOE}$ 206, from a reference source 202. Reference source 202 is a trusted metrology system, a simulator, or any combination employed to generate a DOE set of geometric model parameter values, $P_{ij}^{DOE}$, as described hereinbefore. The DOE set of geometric model parameter values, $P_{ij}^{DOE}$ 206 are communicated to perturbation generator module 204. Perturbation generator module 204 generates a set of perturbations of each of the geometric model parameter values, $P_{ij}^{DOE}$ 206. In some embodiments, a set of perturbations includes a number of values in range of +/−30% of each of the nominal geometric model parameter values, $P_{ij}^{DOE}$ 206. In some embodiments, the number of perturbations associated with each parameter is 10 or more. Each of the set of perturbations, $dP_k$ 209 is added to the corresponding geometric model parameter value, $P_{ij}^{DOE}$ 206 and the sum, $(P_{ij}^{DOE}+dP_k)$ 210 is provided as input to machine learning module 201. In addition, perturbation generator module 204 determines the known error value, $ERR_{ijk}^*$ 208, associated with each error sample and each perturbed parameter value, $(P_{ij}^{DOE}+dP_k)$ 210, and provides the known error value to error evaluation module 203. In general, the known error value associated with each sample in parameter space, each individual parameter, and each error sample is computed as a distance between the known, DOE parameter value and the perturbed parameter value. In this manner, for each measurement sample, $S_i$, multiple parameter perturbations associated with each parameter, $P_{ij}+dP_k$, and the corresponding parameter specific error, $Err_{ijk}$, are computed.

In another aspect, values of parameters of interest are estimated based on the trained scanning conditional measurement model. Measurement data and a set of candidate values associated with each parameter of interest are provided as input to a trained scanning conditional measurement model. The trained scanning conditional measurement model generates an error value associated with each candidate value. The estimated value of each parameter of interest is selected as the candidate value of each parameter of interest having the smallest error value.

Figure 3:
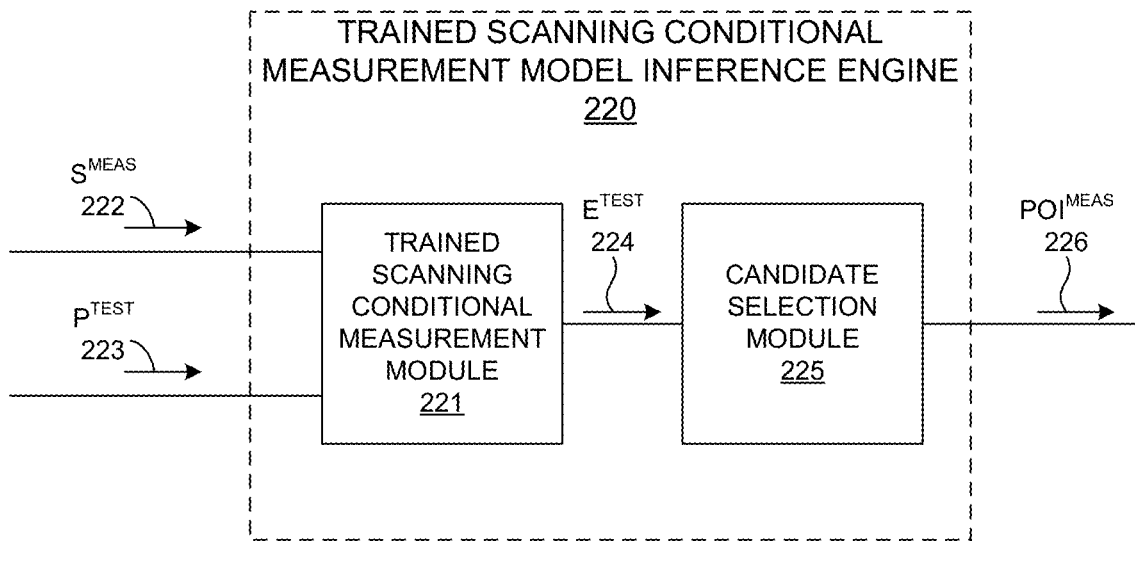
FIG. 3 is a diagram illustrative of a trained scanning conditional measurement model inference engine 220 in one embodiment.

FIG. 3 is a diagram illustrative of a trained scanning conditional measurement model inference engine 220 in one embodiment. As depicted in FIG. 3, trained scanning conditional measurement model inference engine 220 includes a trained scanning conditional measurement module 221 and candidate selection module 225. In the embodiment depicted in FIG. 3, measured data, $S^{MEAS}$ 222, collected by a metrology system or combination of metrology systems and a set of candidate values of one or more parameters of interest, $p^{TEST}$ 223 are provided as input to the trained scanning conditional measurement module 221. The trained scanning conditional measurement module 221 employs the trained scanning conditional measurement model to determine an error value associated with each candidate value of each parameter of interest. The error values, $E^{TEST}$ 224, associated with each parameter of interest are provided to candidate selection module 225. Candidate selection module 225 selects the candidate value associated with each parameter of interest having the smallest error. The selected candidate value is the estimated value of the corresponding parameter of interest, $POI^{MEAS}$ 226.

Figure 4:
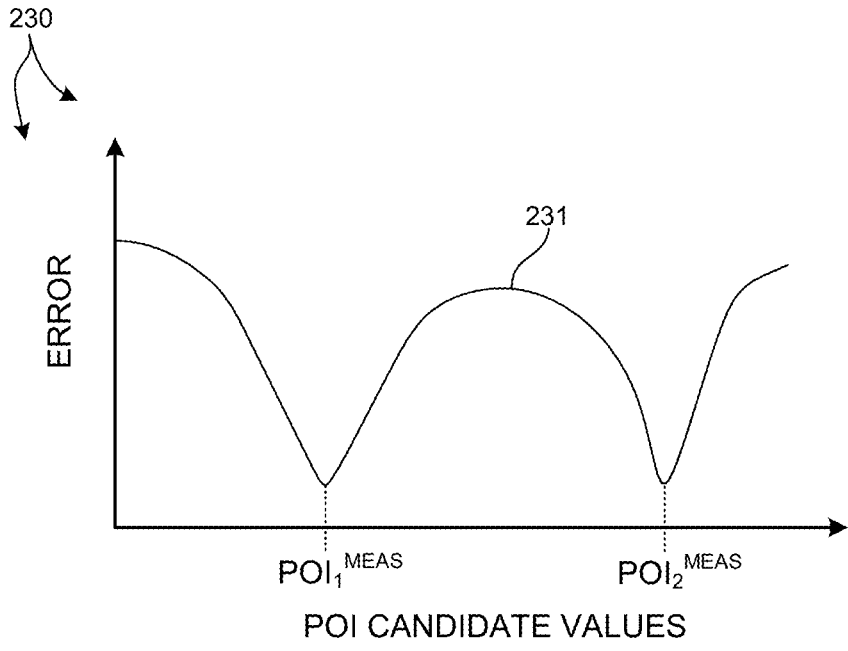
FIG. 4 depicts a plot illustrative of a locus of error values associated with a range of candidate values of a parameter of interest.

FIG. 4 depicts an illustration of a locus of error values 231 associated with a range of candidate values of a parameter of interest. As depicted in FIG. 4, the candidate values having the smallest error are selected as the estimated value of the parameter of interest. As illustrated in FIG. 4, the scanning nature of the trained scanning conditional model enables the trained model to predict two different values ($POI_1^{MEAS}$ and $POI_2^{MEAS}$) for a parameter of interest. In one example, the measurement of pitch walk requires the extraction of two different values of a parameter of interest from the same set of measurement signals.

In some measurement applications it is important to determine a two-dimensional shape of a structure under measurement (e.g., memory measurement applications). In some of these measurement applications, two parameters are employed as input to a trained scanning conditional measurement model.

Figure 5:
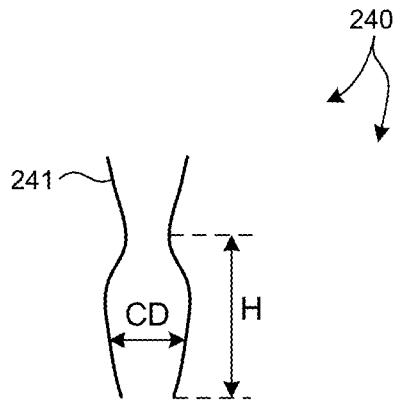
FIG. 5 is a diagram illustrative of a hole structure parameterized by two geometric parameters.

FIG. 5 depicts an illustration of a hole structure 240 parameterized by two geometric parameters. As depicted in FIG. 5, the shape 241 of hole structure 240 is described by a critical dimension parameter (CD) and a height parameter (H). In this example, the CD and H parameters describe the shape of the hole structure and are employed as input to a trained scanning conditional measurement model.

Figure 6:
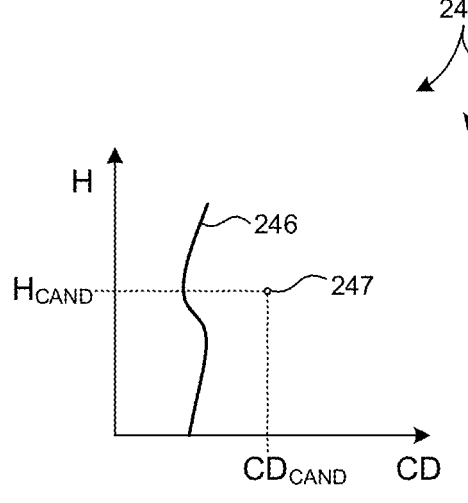
FIG. 6 is a diagram illustrative of a map of error values associated with a range of candidate values of a critical dimension (CD) and height (H).
Figures 7A, 7B, 7C, 7D, 7E, 7F:
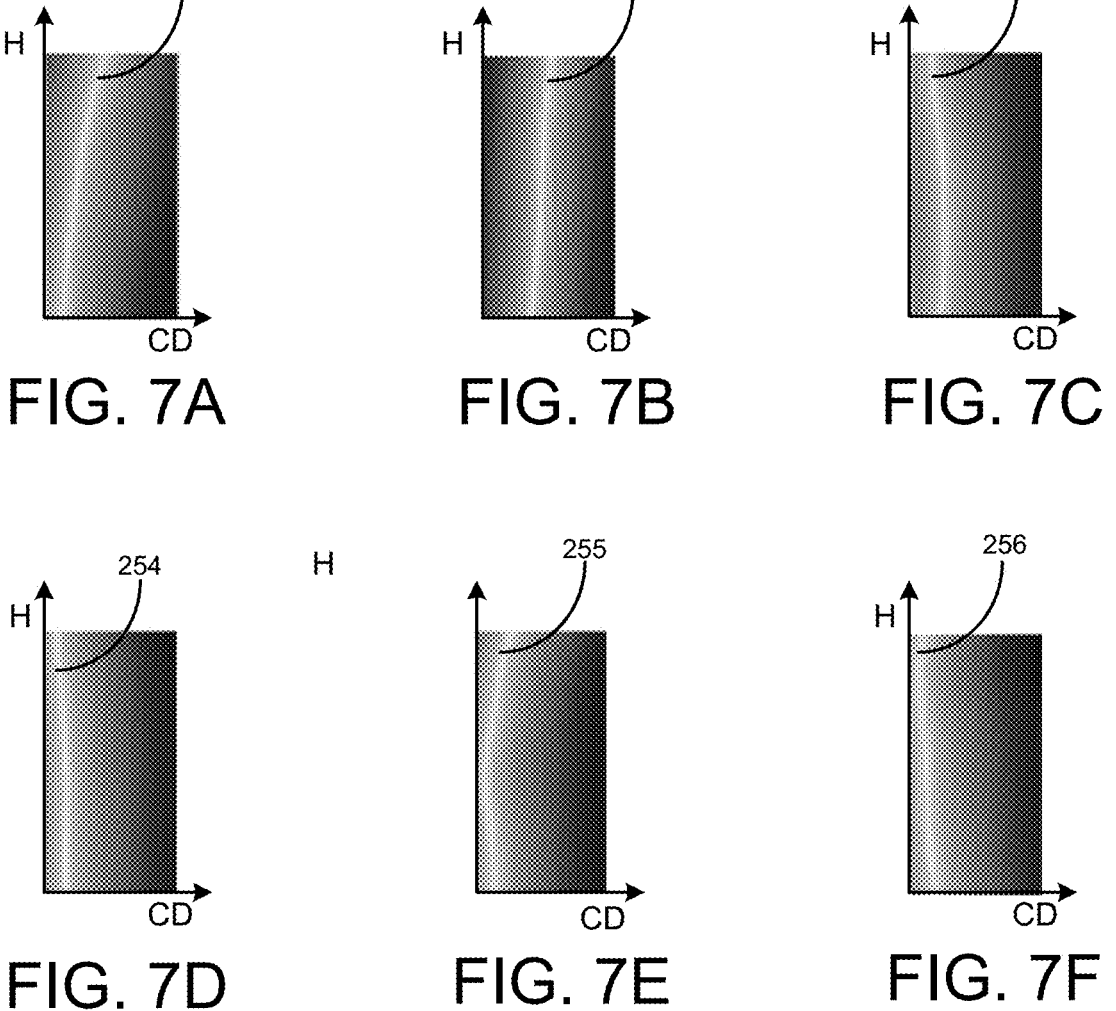
FIGS. 7A-F are plots illustrative of a map of error values associated with a range of candidate values of CD and H associated with measurements of different instances of a hole structure.
Figures 8A, 8B, 8C, 8D, 8E, 8F:
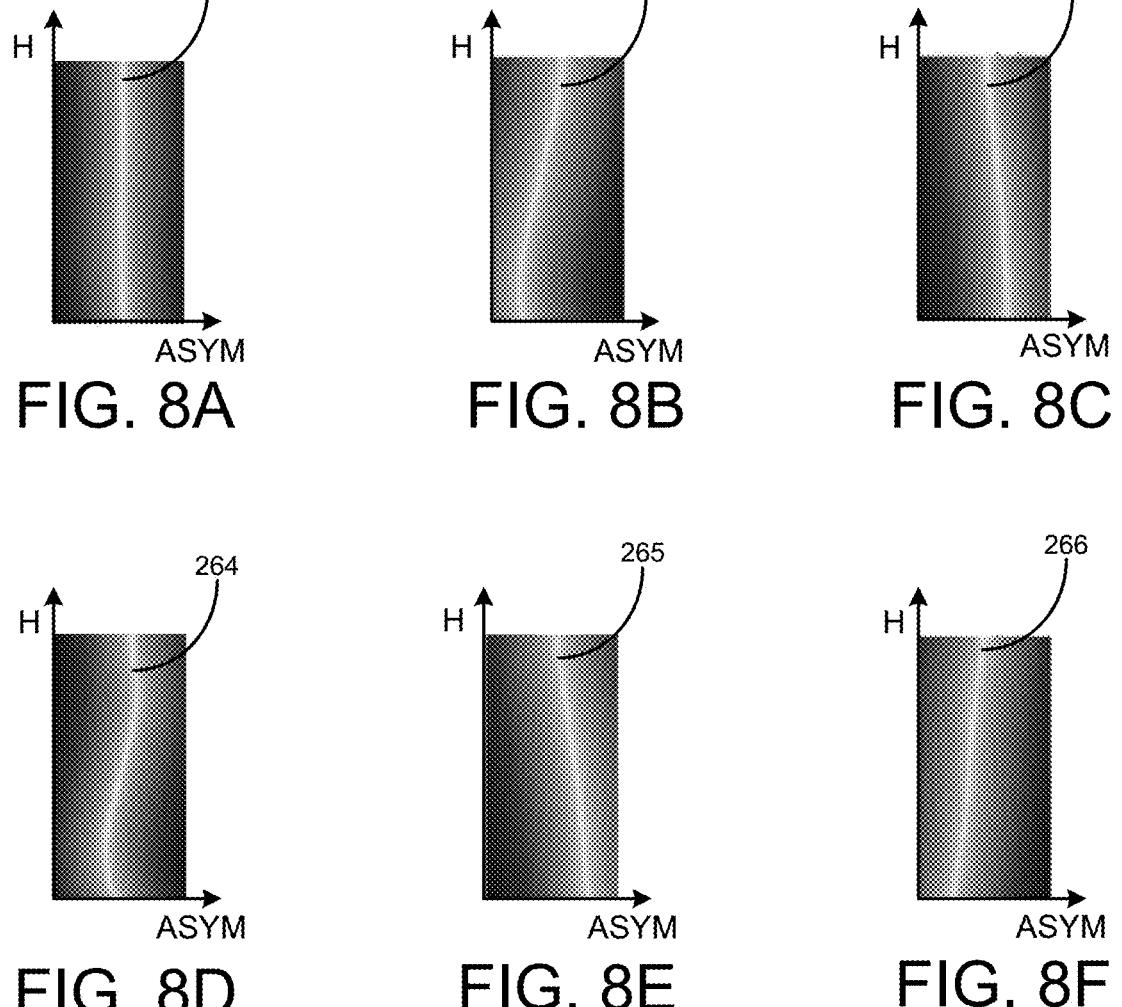
FIGS. 8A-F are plots illustrative of a map of error values associated with a range of candidate values of asymmetry (ASYM) and H associated with measurements of different instances of a hole structure.

FIG. 6 depicts an illustration of a map of error values 245 associated with a range of candidate values of CD and H. Point 247 on the map of error values is associated with a specific combination of candidate values ($CD_{CAND}$, $H_{CAND}$). Line 246 marks a locus of points having a minimum error value over the range of height values. The locus of minimum values represents the points on the map 245 having the highest probability of aligning with the profile of the measured hole structure. In this manner, line 246 depicts an image of the shape 241 of the profile of hole structure 240.

Each of FIGS. 7A-F depict an illustration of a map of error values associated with a range of candidate values of CD and H associated with measurements of different instances of a hole structure.

FIGS. 7A-F depict a locus of points 251-256, respectively, having a minimum error value over the range of height values. The locus of minimum values represents the points on the map having the highest probability of aligning with the profile of the measured hole structure. In this manner, lines 251-256 depict an image of the shape 251-256, respectfully, of the profile of each of the measured hole structure.

Each of FIGS. 8A-F depict an illustration of a map of error values associated with a range of candidate values of asymmetry (ASYM) and H associated with measurements of different instances of a hole structure.

FIGS. 8A-F depict a locus of points 261-266, respectively, having a minimum error value over the range of height values. The locus of minimum values represents the points on the map having the highest probability of aligning with the profile of the measured hole structure. In this manner, lines 261-266 depict an image of the shape 261-266, respectfully, of the profile of each of the measured hole structure.

In general, a trained scanning conditional measurement model as described herein may be applied to estimate values of any parameter of interest employed to characterize the geometry of a measured structure (e.g., critical dimension, height, tilt, asymmetry, ellipticity, helix, etc.).

In some measurement applications it is important to determine a three-dimensional shape of a structure under measurement. In some of these measurement applications, a voxel model is employed to characterize the structure under measurement.

Figure 9:
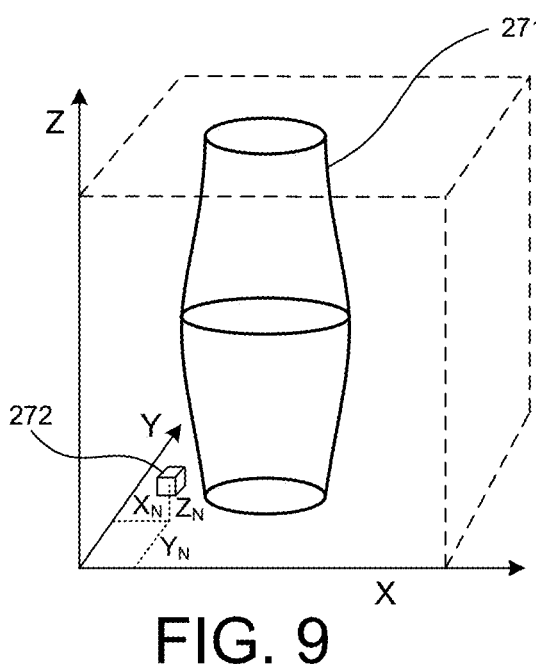
FIG. 9 is a diagram illustrative of a voxel model of a channel hole structure.
Figure 10A:
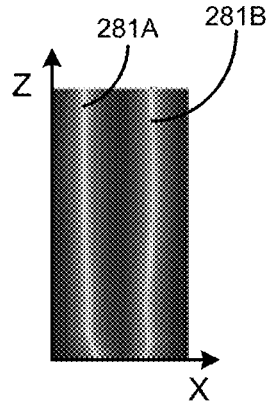
FIGS. 10A-F are plots illustrative of a cross-sectional view of a three dimensional image of error values associated with the range of voxel locations for different measured instances of a channel hole structure.
Figure 10B:
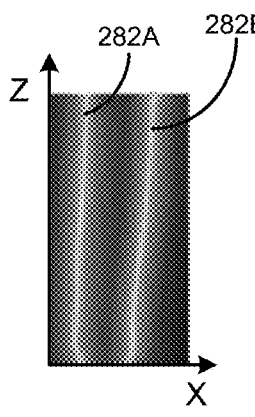
Figure 10C:
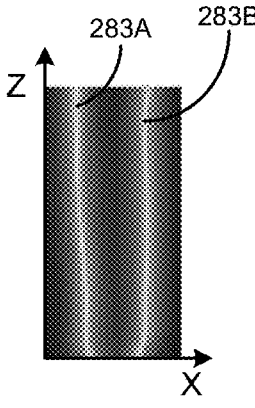
Figure 10D:
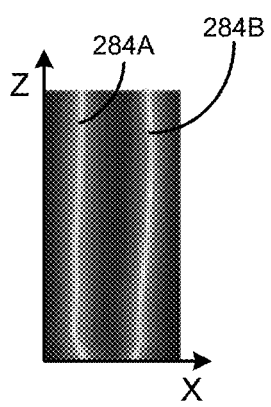
Figure 10E:
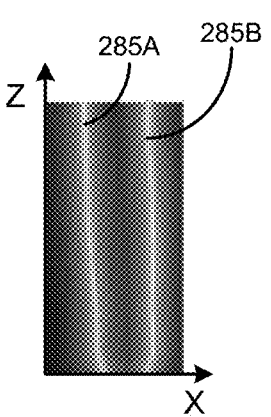
Figure 10F:
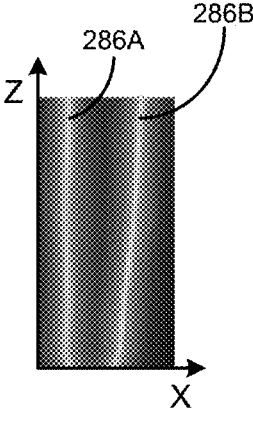

FIG. 9 depicts an illustration of a voxel model of a channel hole structure 271. The geometric model of channel hole structure 271 is characterized by a grid array of voxels spanning a three dimensional volume enveloping the measured structure. The size and spacing of the voxels of the array is known apriori. As illustrated in FIG. 9, the $n^{th}$ voxel 272 is positioned at coordinates $\{X_n, Y_n, Z_n\}$ in three dimensional space and the size of the $n^{th}$ voxel is known. Each voxel is parameterized by a value of a property (e.g., transparency, electron density, etc.) of the voxel. In this manner the value associated with each of the voxels define a three dimensional image of the geometry of the channel hole structure 271 under measurement.

A scanning conditional measurement model of the channel hole structure 271 is trained based on perturbed values of a DOE set geometric model parameter values, $P_{IJ}^{DOE}$, and corresponding DOE data sets, $S_i^{DOE}$. In this example, the geometric model parameter values are the locations of the voxels having a particular value of the property associated with each voxel (e.g., a minimum value). In this example, a set of perturbations of each of the geometric model parameter values, i.e., a set of perturbations of the three dimensional location of each voxel, $dP_k=(\Delta X_k, \Delta Y_k, \Delta Z_k)$, is generated for training purposes. Each of the set of perturbations, $dP_k$, is added to the corresponding model parameter value, $P_{ij}^{DOE}=(X_{ij}^{DOE}, Y_{ij}^{DOE}, Z_{ij}^{DOE})$ and the sum, $P_{ij}^{DOE}+dP_k$ is provided as input to machine learning module 201. In addition, the known error value, $ERR_{ijk}^*$, associated with each error sample is determined, for example, as the distance between the each nominal voxel location and the perturbed voxel location, for each error sample. The known error value is calculated for each DOE measurement sample, each individual voxel, and each error sample. In this manner, for each measurement sample, $S_i$, multiple parameter perturbations associated with each voxel, and the corresponding parameter specific error, $Err_{ijk}$, are computed and employed to train a scanning conditional measurement model of channel hole structure 271 as described with reference to FIG. 2.

The trained scanning conditional measurement model of channel hole structure 271 is employed to estimate a three dimensional image of a measured channel hole structure based on measurement data, $S^{MEAS}$, collected from a channel hole structure having unknown shape. As described with reference to FIG. 3, the measurement data, $S^{MEAS}$, and a set of voxel locations, $p^{TEST}$, are provided as input to the trained scanning conditional measurement model. The set of voxel locations scans the three dimensional space occupied by the measured channel hole. The trained scanning conditional measurement model determines an error value associated with each of the voxel locations. The error values, $E^{TEST}$, associated with each voxel location are evaluated and the voxel locations having the smallest error outline the surfaces of the channel hole.

FIGS. 10A-F each depict an illustration of a cross-sectional view of a three dimensional image of error values associated with the range of voxel locations for different measured instances of a channel hole structure. The bright lines 281A-286A and 281B-286B illustrate the locus of points having the smallest error across the cross-section of each measured channel hole structure, respectively. In this manner, bright lines 281A-286A illustrate the left side of the profile of each measured channel hole structure, respectively, and bright lines 281B-286B illustrate the right side of the profile of each measured channel hole structure.

In general, three dimensional images of a measured structure enable evaluation of tilt, asymmetry, ellipticity, helix, critical dimensions, sidewall angle, etc. from the same three dimensional image.

In some embodiments, a three dimensional image of a measured structure is reconstructed using a trained scanning conditional model by evaluating each voxel in a sequential manner. In these embodiments, the error associated with each voxel is determined sequentially. The smaller the error, the closer the predicted voxel value is to the true voxel value.

In some other embodiments, a three dimensional image of a measured structure is reconstructed by replicating a trained scanning conditional model for each voxel and evaluating all voxels in parallel.

In general, any number of geometric parameters may be employed as input to train and use a scanning conditional measurement model. Similarly, any combination of measurement signals may be employed as input to train and use a scanning conditional measurement model (e.g., signals from one or more optical metrology systems, one or more x-ray metrology systems, or a combination thereof).

In another further aspect, the trained scanning conditional measurement model is employed to estimate values of parameters of interest based on actual measurements of structures having unknown values of one or more parameters of interest. The actual measurement data (e.g., measured spectra) is collected by a measurement system (e.g., metrology system 100). In some embodiments, the measurement system is the same measurement system employed to collect the DOE measurement data. In other embodiments, the measurement system is the system simulated to generate the DOE measurement data synthetically. In one example, the actual measurement data includes measured spectra 111 collected by metrology system 100 from one or more metrology targets having unknown values of the one or more parameters of interest.

In general, the trained scanning conditional measurement model may be employed to estimate values of parameters of interest based on a single measured spectrum or estimate values of parameters of interest simultaneously based on multiple spectra.

In some examples, the measurement data associated with the measurement of each of multiple instances of one or more Design of Experiments (DOE) metrology targets by a metrology system is simulated. The simulated data is generated from a parameterized model of the measurement of each of the one or more DOE metrology structures by the metrology system.

In some other examples, the measurement data associated with multiple instances of one or more Design of Experiments (DOE) metrology targets is actual measurement data collected by a metrology system or multiple instances of a metrology system. In some embodiments, the same metrology system or multiple instances of the metrology system is employed to collect the actual measurement data from instances of metrology targets having unknown values of one or more parameters of interest. In some embodiments, a different instance of the metrology system or multiple, different instances of the metrology system is employed to collect the actual measurement data from instances of metrology targets having unknown values of one or more parameters of interest.

In some embodiments, values of parameters of interest employed to train a scanning conditional measurement model are derived from measurements of DOE wafers by a reference metrology system. The reference metrology system is a trusted measurement system that generates sufficiently accurate measurement results. In some examples, reference metrology systems are too slow to be used to measure wafers on-line as part of the wafer fabrication process flow, but are suitable for off-line use for purposes such as model training. By way of non-limiting example, a reference metrology system may include a stand-alone optical metrology system, such as a spectroscopic ellipsometer (SE), SE with multiple angles of illumination, SE measuring Mueller matrix elements, a single-wavelength ellipsometer, a beam profile ellipsometer, a beam profile reflectometer, a broadband reflective spectrometer, a single-wavelength reflectometer, an angle-resolved reflectometer, an imaging system, a scatterometer, such as a speckle analyzer, an X-ray based metrology system such as a small angle x-ray scatterometer (SAXS) operated in a transmission or grazing incidence mode, an x-ray diffraction (XRD) system, an x-ray fluorescence (XRF) system, an x-ray photoelectron spectroscopy (XPS) system, an x-ray reflectometer (XRR) system, a Raman spectroscopy system, an atomic force microscopy (AFM) system, a transmission electron microscopy system, a scanning electron microscopy system, a soft X-ray reflectometry system, an imaging based metrology system, a hyperspectral imaging based metrology system, a scatterometry overlay metrology system, or other technologies capable of determining device geometry.

In some embodiments, a measurement model trained as described herein is implemented as a neural network model. In other examples, a measurement model may be implemented as a linear model, a non-linear model, a polynomial model, a response surface model, a support vector machines model, a decision tree model, a random forest model, a kernel regression model, a deep network model, a convolutional network model, or other types of models.

In yet another further aspect, the measurement results described herein can be used to provide active feedback to a process tool (e.g., lithography tool, etch tool, deposition tool, etc.). For example, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values determined using a trained scanning conditional measurement model may be communicated to the process tool. In one embodiment, computing system 130 determines values of one or more parameters of interest during process based on measured signals 111 received from a measurement system. In addition, computing system 130 communicates control commands to a process controller (not shown) based on the determined values of the one or more parameters of interest. The control commands cause the process controller to change the state of a process (e.g., stop the etch process, change the diffusivity, change lithography focus, change lithography dosage, etc.).

In some embodiments, the methods and systems for metrology of semiconductor devices as described herein are applied to the measurement of memory structures. These embodiments enable optical critical dimension (CD), film, and composition metrology for periodic and planar structures.

In some examples, the measurement models are implemented as an element of a SpectraShape® optical critical-dimension metrology system available from KLA-Tencor Corporation, Milpitas, California, USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, California, USA. The resulting, trained model may be incorporated as an element of an AcuShape® library that is accessible by a metrology system performing measurements.

FIG. 11 illustrates a method 300 of training a scanning conditional measurement model in at least one novel aspect. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, an amount of measurement data is collected from measurements of one or more structures disposed on a first wafer.

In block 302, a set of candidate values of one or more parameters of interest that characterize a shape of the one or more structures disposed on the first wafer is generated.

In block 303, an error value associated with each of the set of candidate values of the one or more parameters of interest is determined based on a trained scanning conditional measurement model. Each of the set of candidate values and the amount of measurement data are provided as input to the trained scanning conditional measurement model.

In block 304, a first estimated value of each of the one or more parameters of interest is determined. The first estimated value is a first of the set of candidate values of each of the one or more parameters of interest having a first minimum error value.

In a further embodiment, system 100 includes one or more computing systems 130 employed to perform measurements of semiconductor structures based on a trained scanning conditional measurement model in accordance with the methods described herein. The one or more computing systems 130 may be communicatively coupled to one or more spectrometers, active optical elements, process controllers, etc. In one aspect, the one or more computing systems 130 are configured to receive measurement data associated with spectral measurements of structures of wafer 101.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein.

Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the techniques described herein.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:

one or more metrology systems each including an illumination source and a detector, each illumination source configured to generate an amount of illumination light characterized by one or more physical properties and each detector configured to collect an amount of measurement data from measurements of one or more structures disposed on a first wafer, the amount of measurement data dependent on the one or more physical properties of the amount of illumination light and one or more physical characteristics of the one or more structures disposed on the first wafer; and a computing system configured to:

generate a set of candidate values of one or more parameters of interest that characterize a shape of the one or more structures disposed on the first wafer;

determine an error value associated with each of the set of candidate values of the one or more parameters of interest based on a trained scanning conditional measurement model, wherein each of the set of candidate values and the amount of measurement data are provided as input to the trained scanning conditional measurement model;

determine a first estimated value of each of the one or more parameters of interest, wherein the first estimated value is a first of the set of candidate values of each of the one or more parameters of interest having a first minimum error value; and communicate an indication of the first estimated value of each of the one or more parameters of interest to a semiconductor fabrication tool that causes the semiconductor fabrication tool to adjust one or more parameters of a fabrication process of the semiconductor fabrication tool to achieve a desired output from the semiconductor fabrication tool.

2. The system of claim 1, the computing system further configured to:

receive a Design Of Experiments (DOE) dataset of measurement data associated with measurements of a plurality of DOE structures characterized by a set of DOE parameter values; and train the scanning conditional measurement model based on the DOE dataset of measurement data corresponding to the set of DOE parameter values and a set of perturbed values of each of the set of DOE parameter values.

3. The system of claim 2, wherein the DOE dataset of measurement data is actual measurement data collected from the plurality of DOE structures fabricated in accordance with the set of DOE parameter values.

4. The system of claim 3, wherein the set of DOE parameter values are measured by a trusted reference metrology system.

5. The system of claim 3, wherein the set of DOE parameter values are known, programmed values employed to fabricate the plurality of DOE structures.

6. The system of claim 2, wherein the DOE dataset of measurement data is simulated based on the set of DOE parameter values, wherein the set of DOE parameter values are known values associated with the simulation.

7. The system of claim 2, wherein the set of DOE parameter values are simulated based on a DOE dataset of process parameter values, and wherein the DOE dataset of measurement data is simulated based on the set of DOE parameter values.

8. The system of claim 2, wherein the scanning conditional measurement model is a machine learning based model.

9. The system of claim 1, the computing system further configured to:

determine a second estimated value of each of the one or more parameters of interest, wherein the second estimated value is a second of the set of candidate values of each of the one or more parameters of interest having a second minimum error value.

10. The system of claim 1, wherein the one or more parameters of interest characterize a two dimensional shape of the one or more structures disposed on the first wafer.

11. The system of claim 1, wherein the one or more parameters of interest characterize a three dimensional shape of the one or more structures disposed on the first wafer.

12. The system of claim 1, wherein the amount of measurement data includes measurements of the one or more structures by at least one optical based metrology system, at least one x-ray based metrology system, or any combination thereof.

13. A method comprising:

collecting an amount of measurement data from measurements of one or more structures disposed on a first wafer, the collecting of the amount of measurement data involving an illumination source configured to generate an amount of illumination light characterized by one or more physical properties and a detector configured to collect the amount of measurement data, the amount of measurement data dependent on the one or more physical properties of the amount of illumination light and one or more physical characteristics of the one or more structures disposed on the first wafer;

generating a set of candidate values of one or more parameters of interest that characterize a shape of the one or more structures disposed on the first wafer;

determining an error value associated with each of the set of candidate values of the one or more parameters of interest based on a trained scanning conditional measurement model, wherein each of the set of candidate values and the amount of measurement data are provided as input to the trained scanning conditional measurement model;

determining a first estimated value of each of the one or more parameters of interest, wherein the first estimated value is a first of the set of candidate values of each of the one or more parameters of interest having a first minimum error value; and communicating an indication of the first estimated value of each of the one or more parameters of interest to a semiconductor fabrication tool that causes the semiconductor fabrication tool to adjust one or more parameters of a fabrication process of the semiconductor fabrication tool to achieve a desired output from the semiconductor fabrication tool.

14. The method of claim 13, further comprising:

receiving a Design Of Experiments (DOE) dataset of measurement data associated with measurements of a plurality of DOE structures characterized by a set of DOE parameter values; and training the scanning conditional measurement model based on the DOE dataset of measurement data corresponding to the set of DOE parameter values and a set of perturbed values of each of the set of DOE parameter values.

15. The method of claim 14, wherein the DOE dataset of measurement data is actual measurement data collected from the plurality of DOE structures fabricated in accordance with the set of DOE parameter values.

16. The method of claim 14, wherein the DOE dataset of measurement data is simulated based on the set of DOE parameter values, wherein the set of DOE parameter values are known values associated with the simulation.

17. The method of claim 14, wherein the set of DOE parameter values are simulated based on a DOE dataset of process parameter values, and wherein the DOE dataset of measurement data is simulated based on the set of DOE parameter values.

18. The method of claim 14, wherein the scanning conditional measurement model is a machine learning based model.

19. The method of claim 13, further comprising:

determining a second estimated value of each of the one or more parameters of interest, wherein the second estimated value is a second of the set of candidate values of each of the one or more parameters of interest having a second minimum error value.

20. The method of claim 13, wherein the one or more parameters of interest characterize a two dimensional shape or a three dimensional shape of the one or more structures disposed on the first wafer.

21. The method of claim 13, wherein the amount of measurement data includes measurements of the one or more structures by at least one optical based metrology system, at least one x-ray based metrology system, or any combination thereof.

22. A system comprising:

one or more metrology systems each including an illumination source and a detector, each illumination source configured to generate an amount of illumination light characterized by one or more physical properties and each detector configured to collect an amount of measurement data from measurements of one or more structures disposed on a first wafer, the amount of measurement data dependent on the one or more physical properties of the amount of illumination light and one or more physical characteristics of the one or more structures disposed on the first wafer; and a non-transitory, computer-readable medium including instructions that when executed by one or more processors of a computing system cause the computing system to:

generate a set of candidate values of one or more parameters of interest that characterize a shape of the one or more structures disposed on the first wafer;

determine an error value associated with each of the set of candidate values of the one or more parameters of interest based on a trained scanning conditional measurement model, wherein each of the set of candidate values and the amount of measurement data are provided as input to the trained scanning conditional measurement model;

determine a first estimated value of each of the one or more parameters of interest, wherein the first estimated value is a first of the set of candidate values of each of the one or more parameters of interest having a first minimum error value; and communicate an indication of the first estimated value of each of the one or more parameters of interest to a semiconductor fabrication tool that causes the semiconductor fabrication tool to adjust one or more parameters of a fabrication process of the semiconductor fabrication tool to achieve a desired output from the semiconductor fabrication tool.

23. The system of claim 22, the non-transitory, computer-readable medium further including the instructions that when executed by the one or more processors of the computing system cause the computing system to:

receive a Design Of Experiments (DOE) dataset of measurement data associated with measurements of a plurality of DOE structures characterized by a set of DOE parameter values; and train the scanning conditional measurement model based on the DOE dataset of measurement data corresponding to the set of DOE parameter values and a set of perturbed values of each of the set of DOE parameter values.

* * * * *